US010879341B2

(12) United States Patent
Song et al.

(10) Patent No.: US 10,879,341 B2
(45) Date of Patent: Dec. 29, 2020

(54) INTEGRATED DEVICE PACKAGE COMPRISING A REAL TIME TUNABLE INDUCTOR IMPLEMENTED IN A PACKAGE SUBSTRATE

(71) Applicant: QUALCOMM Incorporated, San Diego, CA (US)

(72) Inventors: Young Kyu Song, San Diego, CA (US); Sangjo Choi, San Diego, CA (US); Jong-Hoon Lee, San Diego, CA (US); Paragkumar Ajaybhai Thadesar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 772 days.

(21) Appl. No.: 15/002,138

(22) Filed: Jan. 20, 2016

(65) Prior Publication Data
US 2017/0207293 A1 Jul. 20, 2017

(51) Int. Cl.
*H01L 49/02* (2006.01)
*H01F 21/12* (2006.01)
*H01L 23/498* (2006.01)

(52) U.S. Cl.
CPC .............. *H01L 28/10* (2013.01); *H01F 21/12* (2013.01); *H01L 23/49822* (2013.01); *H01F 2021/125* (2013.01); *H01L 2224/16225* (2013.01); *H01L 2224/32225* (2013.01); *H01L 2224/73204* (2013.01); *H01L 2924/15311* (2013.01); *H01L 2924/181* (2013.01)

(58) Field of Classification Search
CPC ......... H01L 28/10; H01F 21/12; H01F 21/125
See application file for complete search history.

(56) References Cited

U.S. PATENT DOCUMENTS

| 6,573,822 | B2 | 6/2003 | Ma et al. |
| 7,012,323 | B2 | 3/2006 | Warner et al. |
| 7,064,645 | B2 | 6/2006 | Kobayashi et al. |
| 7,202,768 | B1 | 4/2007 | Harvey et al. |
| 7,336,147 | B2 | 2/2008 | Watanabe et al. |

(Continued)

FOREIGN PATENT DOCUMENTS

EP 2662870 A1 * 11/2013 ............. H01F 21/12
JP 2013110351 A 6/2013

*Primary Examiner* — Jared Fureman
*Assistant Examiner* — Christopher J Clark
(74) *Attorney, Agent, or Firm* — Loza & Loza, LLP/Qualcomm

(57) ABSTRACT

Some features pertain to a device package that includes a die and a package substrate. The die includes a first switch. The package substrate is coupled to the die. The package substrate includes at least one dielectric layer, a primary inductor, and a first secondary inductor coupled to the first switch of the die. The first secondary inductor and the first switch are coupled to a plurality of interconnects configured to provide an electrical path for a reference ground signal. The primary inductor is configurable to have different inductances by opening and closing the first switch coupled to the first secondary inductor. In some implementations, the primary inductor is configurable in real time while the die is operational. In some implementations, the die further includes a second switch, and the package substrate further includes a second secondary inductor coupled to the second switch of the die.

29 Claims, 12 Drawing Sheets

(56) References Cited

U.S. PATENT DOCUMENTS

| | | | |
|---|---|---|---|
| 7,365,628 B2 | 4/2008 | Sato et al. | |
| 7,460,001 B2 | 12/2008 | Jessie | |
| 7,531,407 B2 | 5/2009 | Clevenger et al. | |
| 7,598,838 B2 | 10/2009 | Hargrove et al. | |
| 7,868,409 B2 | 1/2011 | Sasaki | |
| 8,441,334 B2* | 5/2013 | Kawano | H01F 21/02 336/200 |
| 9,806,694 B2* | 10/2017 | Reedy | H03H 11/28 |
| 2005/0134410 A1* | 6/2005 | Franca-Neto | H01Q 1/38 333/247 |
| 2011/0260819 A1 | 10/2011 | Yeh et al. | |
| 2012/0038025 A1 | 2/2012 | Teggatz et al. | |
| 2013/0242499 A1 | 9/2013 | Kang et al. | |
| 2014/0198418 A1* | 7/2014 | Wang | H01L 27/0288 361/56 |
| 2014/0246753 A1 | 9/2014 | Song et al. | |
| 2014/0333391 A1 | 11/2014 | Tsuda | |
| 2017/0207022 A1 | 7/2017 | Song et al. | |

* cited by examiner

INTEGRATED DEVICE PACKAGE COMPRISING A REAL TIME TUNABLE INDUCTOR IMPLEMENTED IN A PACKAGE SUBSTRATE

BACKGROUND

Field

Various features relate generally to an integrated device package, and more specifically to an integrated device package that includes a real time tunable inductor implemented in a package substrate.

Background

FIG. 1 illustrates a configuration of an integrated device package that includes a die. Specifically, FIG. 1 illustrates an integrated device package 100 that includes a first die 102 and a package substrate 106. The package substrate 106 includes a dielectric layer and a plurality of interconnects 110. The package substrate 106 is a laminated substrate. The plurality of interconnects 110 includes traces, pads and/or vias. The first die 102 is coupled to the package substrate 106 through a first plurality of solder balls 112. The package substrate 106 is coupled to a printed circuit board (PCB) 108 through a second plurality of solder balls 116. FIG. 1 illustrates that an inductor 120 is mounted on the PCB 108. The inductor 120 is located externally of the integrated device package 100, and takes up a lot real estate on the PCB 108.

A drawback of the inductor 120 is that the property of the inductor 120 is fixed and cannot be tuned and/or configured to meet changing operational conditions of the first die 102. That is, for example, the inductor 120 has a fixed inductance value, which cannot be changed during the operation of the first die 102.

Another drawback of the inductor 120 shown in FIG. 1 is that it creates a device with a form factor that may be too large for the needs of mobile computing devices and/or wearable computing devices. This may result in a device that is either too large and/or too thick. That is, the combination of the integrated device package 100, the inductor 120 and the PCB 108 shown in FIG. 1 may be too thick and/or have a surface area that is too large to meet the needs and/or requirements of mobile computing devices and/or wearable computing devices.

Therefore, there is a need for an integrated device package with a real time tunable inductor. Ideally, such an integrated device package will include a compact form factor, while at the same time meeting the needs and/or requirements of mobile devices, Internet of Things (IoT) devices, computing devices and/or wearable computing devices.

SUMMARY

Various features relate generally to an integrated device package, and more specifically to an integrated device package that includes a real time tunable inductor implemented in a package substrate.

For example, a device package includes a die and a package substrate. The die includes a first switch. The package substrate is coupled to the die. The package substrate includes at least one dielectric layer, a primary inductor, and a first secondary inductor coupled to the first switch of the die. The primary inductor is configurable to have different inductances by opening and closing the first switch coupled to the first secondary inductor.

Another example, an apparatus includes a die and a package substrate. The die includes a means for switching. The package substrate is coupled to the die. The package substrate includes at least one dielectric layer, a means for primary inductance, and a means for secondary inductance coupled to the means for switching of the die. The means for primary inductance is configurable to have different inductances by opening and closing the means for switching coupled to the means for secondary inductance.

Another example, provides a method for tuning an inductor. The method transmits a signal through a primary inductor comprising a first inductance, where the primary inductor is implemented in a package substrate. The method determines to change the first inductance of the primary inductor. The method closes a first switch coupled to a first secondary inductor to change the first inductance of the primary inductor to a second inductance, where the first switch is implemented in a die, and wherein the first secondary inductor is implemented in the package substrate.

Another example, provides a processor-readable storage medium comprising code for: transmitting a signal through a primary inductor comprising a first inductance, where the primary inductor is implemented in a package substrate; determining to change the first inductance of the primary inductor; and closing a first switch coupled to a first secondary inductor to change the first inductance of the primary inductor to a second inductance, where the first switch is implemented in a die, and wherein the first secondary inductor is implemented in the package substrate.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Some features pertain to an integrated device package that includes a die and a package substrate. The die includes a first switch. The package substrate is coupled to the die. The package substrate includes at least one dielectric layer, a primary inductor, and a first secondary inductor coupled to the first switch of the die. The first secondary inductor and the first switch are coupled to a plurality of interconnects configured to provide an electrical path for a reference ground signal. The primary inductor is configurable to have different inductances by opening or closing the first switch coupled to the first secondary inductor. In some implementations, the primary inductor is configurable in real time while the die is operational. In some implementations, the die further includes a second switch, and the package substrate further includes a second secondary inductor coupled to the second switch of the die. The second secondary inductor and the second switch are coupled to the plurality of interconnects configured to provide an electrical path for a reference ground signal.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may be configured to provide an electrical path for a signal (e.g., data signal, ground signal, power signal). An interconnect may be part of a circuit. An interconnect may include more than one element or component.

Exemplary Real Time Tunable Inductor

Figure 1:
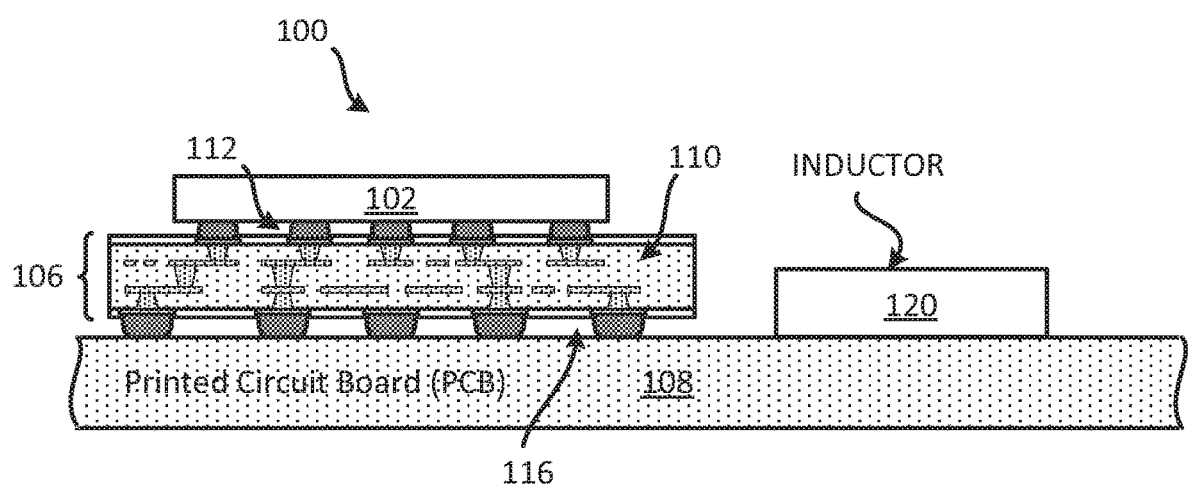
FIG. 1 illustrates a profile view of an integrated device package and an inductor mounted on a printed circuit board (PCB).
Figure 2:
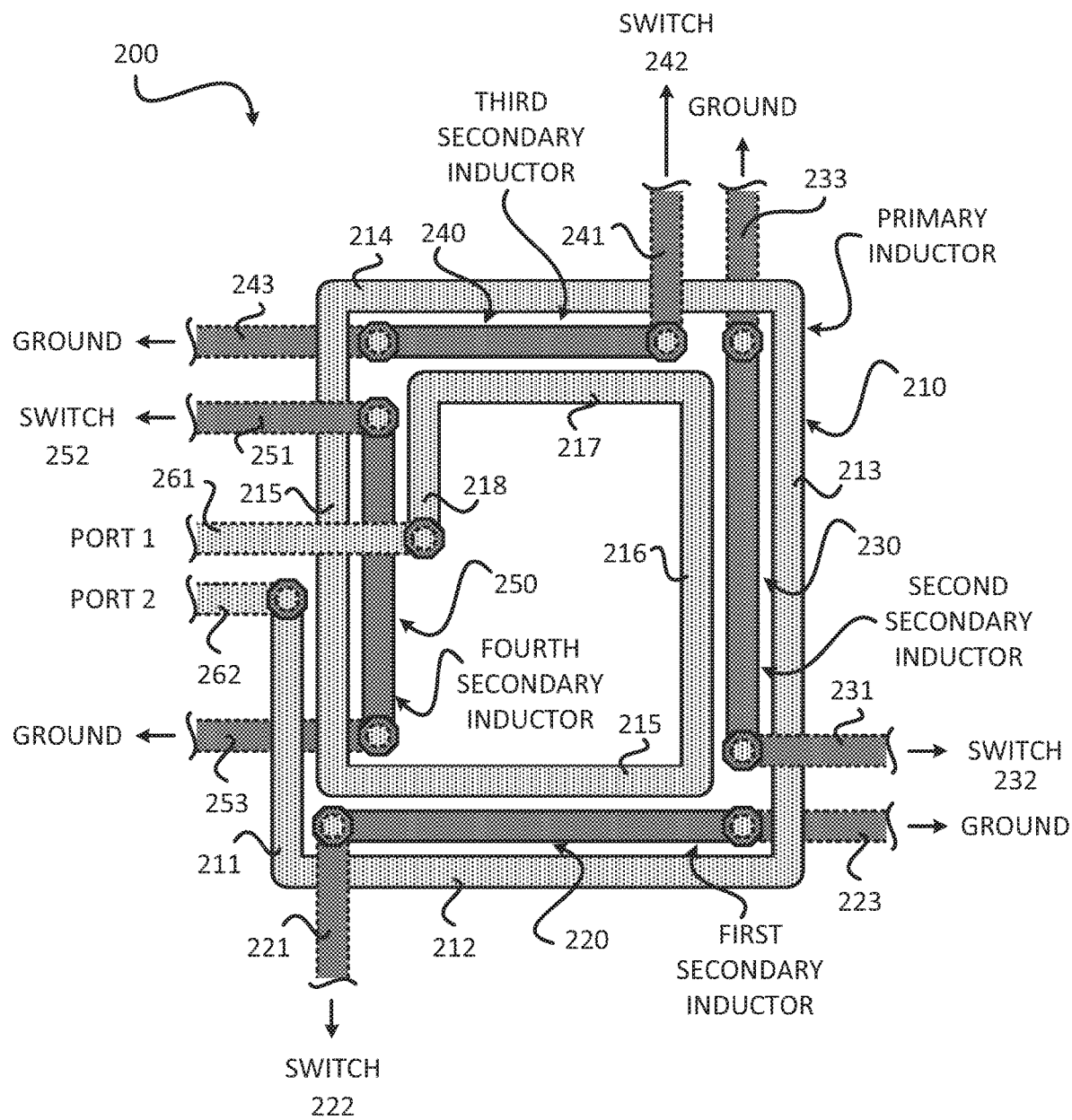
FIG. 2 illustrates a cross-sectional plan view of a real time configurable inductor implemented in a package substrate.

FIG. 2 illustrates an example of a tunable inductor 200. In some implementations, the tunable inductor 200 is a real time tunable inductor that is configurable in real time. In some implementations, a real time tunable inductor is an inductor that can be configured to have one or more effective inductances, during an operation of a die and/or an integrated device package. In some implementations, the tunable inductor 200 is at least partially implemented in a package substrate.

The tunable inductor 200 includes a primary inductor 210, and at least one secondary inductor. For example, as shown in FIG. 2, the tunable inductor 200 includes the primary inductor 210, a first secondary inductor 220, a second secondary inductor 230, a third secondary inductor 240, and a fourth secondary inductor 250. The tunable inductor 200 also includes a first switch 222, a second switch 232, a third switch 242 and a fourth switch 252.

In some implementations, the primary inductor 210, the first secondary inductor 220, the second secondary inductor 230, the third secondary inductor 240, and the fourth secondary inductor 250 are implemented in a package substrate. One or more switches, which are coupled to one or more secondary inductors, may be implemented in a die. As will be further described below in FIGS. 3-5, one or more of the secondary inductors (e.g., first secondary inductor 220) is configured to be electrically coupled to a ground net. A ground net includes a plurality of interconnects (e.g., interconnects in a die, interconnects in a package substrate) that are configured to provide an electrical path for a reference ground signal. The one or more secondary inductors may be configured to be electrically coupled to the ground net through one or more switches. The primary inductor 210 may be configured to be electrically coupled to a die.

The primary inductor 210 includes one or more interconnects (e.g., interconnect 211, interconnect 212, interconnect 213, interconnect 214, interconnect 215, interconnect 216, interconnect 217, interconnects 218). In some implementations, one interconnect may collectively be defined by one or more of the interconnect 211, the interconnect 212, the interconnect 213, the interconnect 214, the interconnect 215, the interconnect 216, the interconnect 217, and the interconnect 218. The interconnect (e.g., interconnect 211) may include a trace and/or pad. In some implementations, a first portion of the primary inductor 210 includes the interconnect 211, and a second portion of the primary inductor 210 includes the interconnect 212. The primary inductor 210 includes a first port 261 (e.g., first terminal) and a second port 262 (e.g., second terminal). The first port 261 and the second port 262 may include interconnects (e.g., traces, pads, vias, bumps).

As shown in FIG. 2, the primary inductor 210 is a spiral inductor that includes two turns. However, in different implementations, the primary inductor 210 may include a different number of turns (e.g., 1, 3, 4).

In some implementations, the first secondary inductor 220, the second secondary inductor 230, the third secondary inductor 240, and the fourth secondary inductor 250 are positioned that they are at least partially co-planar to the primary inductor 210. For example, in some implementations, the first secondary inductor 220, the second secondary inductor 230, the third secondary inductor 240, and the fourth secondary inductor 250 may be formed on the same metal layer of a package substrate as the primary inductor 210. However, in some implementations, one or more of the secondary inductors (e.g., 220, 230, 240, 250) may be on different layers of the package substrate than the primary inductor 210. That is, one or more secondary inductors may not be co-planar with the primary inductor 210. Each of the secondary inductors (e.g., 220, 230, 240, 250) may include one or more interconnects. An interconnect may include a trace, a via, and/or a pad. For example, a secondary inductor may include a trace, a pad and a via.

FIG. 2 illustrates that the first secondary inductor 220, the second secondary inductor 230, the third secondary inductor 240, and the fourth secondary inductor 250 are within the primary inductor 210 (e.g., between interconnects of the primary inductor 210). In some implementations, one or more of the secondary inductor 220 may be positioned outside the boundary of the primary inductor 210.

FIG. also 2 illustrates that the first secondary inductor 220, the second secondary inductor 230, the third secondary inductor 240, and the fourth secondary inductor 250 are positioned near different portions of the primary inductor 210. One or more of the secondary inductors may affect the primary inductor 210 differently, depending on for example, the inductance of the particular secondary inductor and how close the particular secondary inductor is to the primary inductor 210.

Each particular secondary inductor is coupled to a particular switch. Each particular switch is configured to control whether the secondary inductor is on or off (e.g., whether a current or signal may pass through the secondary inductor). When the switch is open, no current or signal may pass through the corresponding secondary inductor. In some implementations, a secondary inductor may affect the primary inductor 210 even when no current or signal may pass through the secondary inductor. When the switch is closed, a current or signal may pass through the corresponding secondary inductor.

As shown in FIG. 2, the first secondary inductor 220 is coupled to the first switch 222, the second secondary inductor 230 is coupled to the second switch 232, the third secondary inductor 240 is coupled to the third switch 242, and the fourth secondary inductor 250 is coupled to the fourth switch 252. The one or more switches (e.g., first switch 222) may be configured to be electrically coupled to the ground net through one or more switches. The first switch 222, the second switch 232, the third switch 242, and the fourth switch 252 may be implemented in a die (e.g., die 811).

The first secondary inductor 220 is coupled to the interconnect 221 and the interconnect 223. The interconnect 221 is coupled to the first switch 222. The interconnect 223 may be coupled to a ground net that is configured to provide an electrical path for a reference ground signal. The interconnect 221 and the interconnect 223 may include (one or more) a trace, a via, and/or a pad. The first interconnect 221 and the interconnect 223 may be formed on the same or different metal layers (e.g., of a package substrate).

The second secondary inductor 230 is coupled to the interconnect 231 and the interconnect 233. The interconnect 231 is coupled to the second switch 232. The interconnect 233 may be coupled to a ground net that is configured to provide an electrical path for a reference ground signal. The interconnect 231 and the interconnect 233 may include (one or more) a trace, a via, and/or a pad. The first interconnect 231 and the interconnect 233 may be formed on the same or different metal layers (e.g., of a package substrate).

The third secondary inductor 240 is coupled to the interconnect 241 and the interconnect 243. The interconnect 241 is coupled to the third switch 242. The interconnect 243 may be coupled to a ground net that is configured to provide an electrical path for a reference ground signal. The interconnect 241 and the interconnect 243 may include (one or more) a trace, a via, and/or a pad. The first interconnect 241 and the interconnect 243 may be formed on the same or different metal layers (e.g., of a package substrate).

The fourth secondary inductor 250 is coupled to the interconnect 251 and the interconnect 253. The interconnect 251 is coupled to the fourth switch 252. The interconnect 253 may be coupled to a ground net that is configured to provide an electrical path for a reference ground signal. The interconnect 251 and the interconnect 253 may include (one or more) a trace, a via, and/or a pad. The first interconnect 251 and the interconnect 253 may be formed on the same or different metal layers (e.g., of a package substrate).

As will be further described in detail below in at least FIGS. 3-6, by selectively turning on and off one or more secondary inductors through the switches, the primary inductor 210 can be configured in real time to have different effective inductances, thus providing the tunable inductor 200.

Exemplary Circuit Diagrams of a Real Time Tunable Inductor

Figure 3:
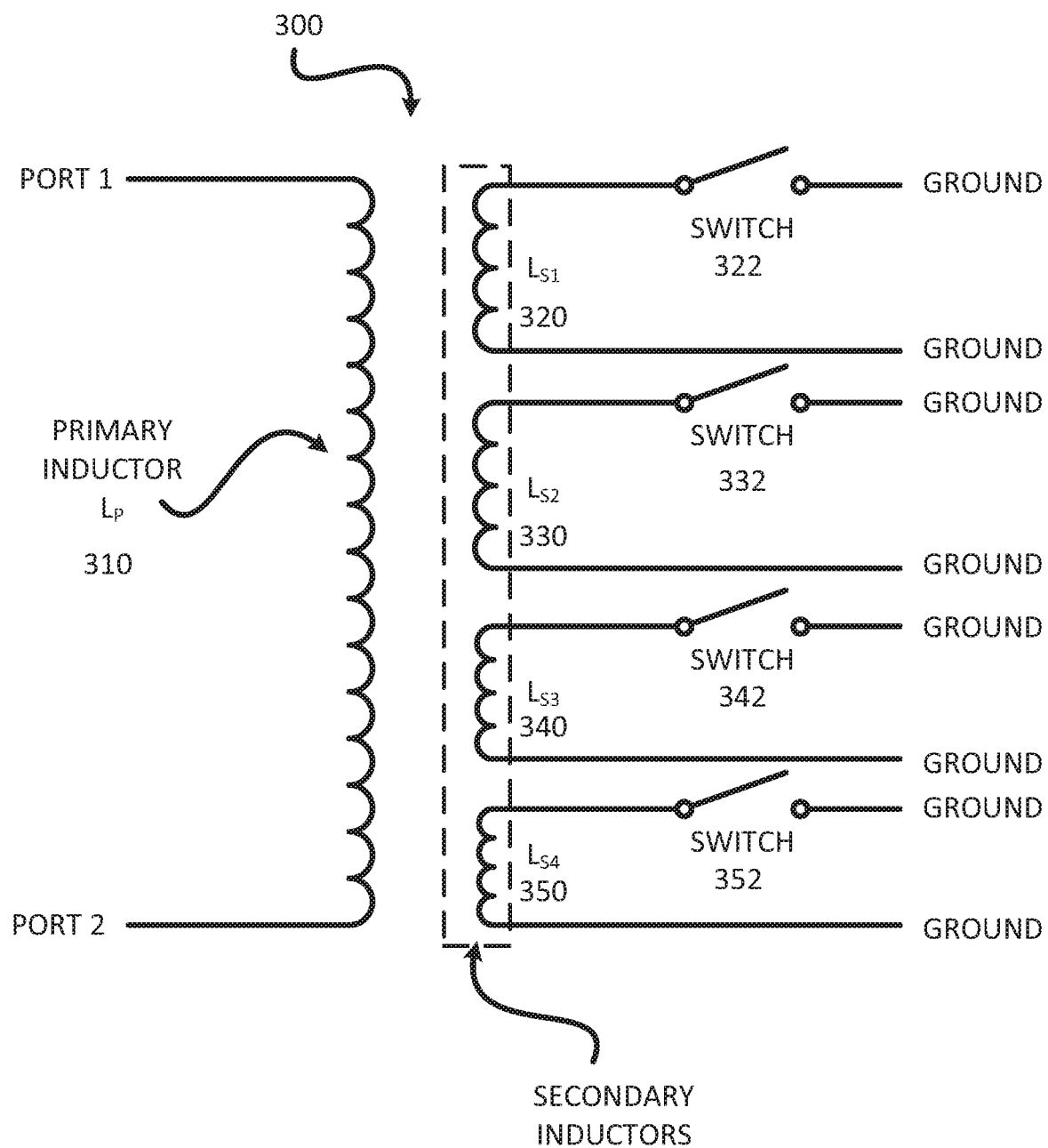
FIG. 3 illustrates a circuit diagram of a real time configurable inductor with all the switches open.

FIG. 3 illustrates an example of a circuit diagram 300 of real time tunable inductor. The circuit diagram 300 includes a primary inductor 310, a first secondary inductor 320, a second secondary inductor 330, a third secondary inductor 340, a fourth secondary inductor 350, a first switch 322, a second switch 332, a third switch 342, and a fourth switch 352.

In some implementations, the primary inductor 310, the second secondary inductor 330, the third secondary inductor 340, and the fourth secondary inductor 350 may be implemented in a package substrate of an integrated device package. In some implementations, the first switch 322, the second switch 332, the third switch 342, and the fourth switch 352 may be implemented in a die of an integrated device package.

The primary inductor 310 may correspond to the primary inductor 210 of FIG. 2. The first secondary inductor 320 may correspond to the first secondary inductor 220 of FIG. 2. The second secondary inductor 330 may correspond to the second secondary inductor 230 of FIG. 2. The third secondary inductor 340 may correspond to the third secondary inductor 240 of FIG. 2. The fourth secondary inductor 350 may correspond to the fourth secondary inductor 250 of FIG. 2.

The first switch 322 is coupled to the first secondary inductor 320. The second switch 332 is coupled to the second secondary inductor 330. The third switch 342 is coupled to the third secondary inductor 340. The fourth switch 352 is coupled to the fourth secondary inductor 350. In some implementations, the first secondary inductor 320, the second secondary inductor 330, the third secondary inductor 340, the fourth secondary inductor 350 are coupled to a ground net. As mentioned above, a ground net includes a plurality of interconnects (e.g., interconnects in a die, interconnects in a package substrate) that are configured to provide an electrical path for a reference ground signal. The one or more secondary inductors (e.g., first secondary inductor 320) may be configured to be electrically coupled to the ground net through one or more switches (e.g., first switch 322).

The primary inductor 310 has an inductance $L_P$. The first secondary inductor 320 has an inductance $L_{S1}$. The second secondary inductor 330 has an inductance $L_{S2}$. The third secondary inductor 340 has an inductance $L_{S3}$. The fourth secondary inductor 350 has an inductance $L_{S4}$.

FIG. 3 illustrates that all the switches (e.g., first switch 322, second switch 332, third switch 342, fourth switch 352) are open. Thus, no current or signal passes through the secondary inductors 320, 330, 340 and 350. For practical purposes, in instances where no current or signal passes through the secondary inductors 320, 330, 340, 350, the inductances of the secondary inductors 320, 330, 340 and 350 is effectively zero (e.g., $L_{S1} \approx 0$).

In such instance, the effective inductance ($L_E$) of the primary inductor 310 is $L_P$. Thus, the effective inductance ($L_E$) of the primary inductor 310 would be approximately the same as if the secondary inductors were not present or nearby.

FIG. 3 illustrates that each secondary inductor (e.g., first secondary inductor 320) includes a first terminal and a second terminal. In some implementations, the first terminal and the second terminal of one or more secondary inductors are coupled to ground (e.g., ground net). For example the first terminal and the second terminal of the first secondary inductor 320 may be coupled to a plurality of interconnects configured to provide an electrical path for a reference ground signal.

Figure 4:
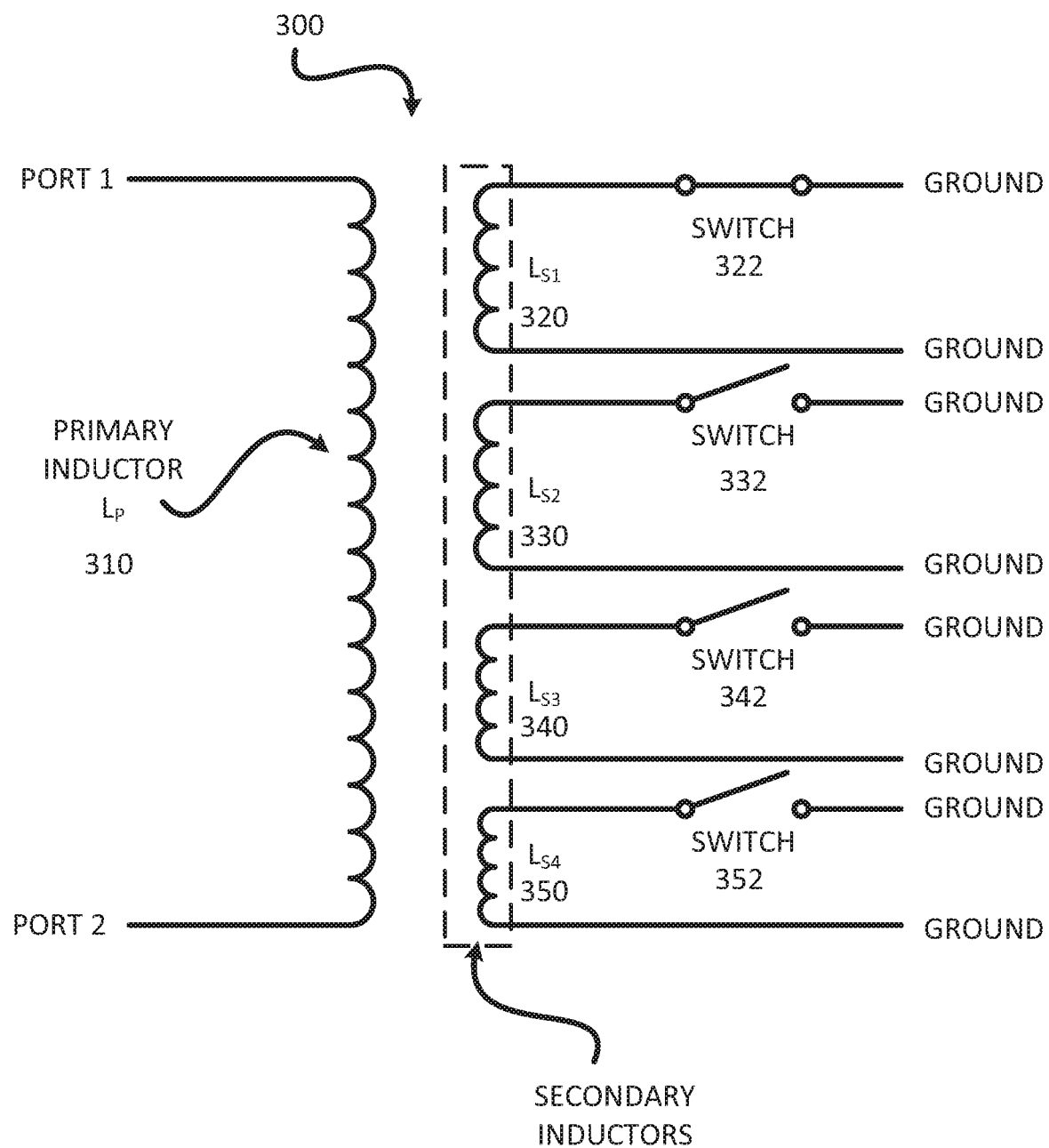
FIG. 4 illustrates a circuit diagram of a real time configurable inductor with some of the switches open.

FIG. 4 illustrates the circuit diagram 300 with a different configuration. FIG. 4 is similar to FIG. 3, except that one of the switches is closed. As shown in FIG. 4, the first switch 322 is closed, which means that a current or signal may pass through the first secondary inductor 320. The second switch 332, the third switch 342, and the fourth switch 352 remain open.

The mutual inductance (M) between the primary inductor 310 and the first secondary inductor 320 may be expressed by the following equation (1):

$$M = K\sqrt{L_P L_S} \qquad (1)$$

where M is the mutual inductance between the two inductors, and K is a coupling coefficient between 0 and 1.

As shown in FIG. 2, the current in the primary inductor generates a current in a secondary inductor when the secondary inductor coil's switch is closed (i.e., the secondary inductor having a ground path). With the two terminals of the secondary inductor (e.g., first secondary inductor 220) connected to ground, the secondary inductor acts as a section of ground plane in a close distance to a section of the primary inductor. Once the secondary inductor (e.g., first secondary inductor 220) is activated as ground using its switch (e.g., first switch 222), the mutual inductance M in a very simple form is calculated using the above equation. However, different implementations may use different mutual inductance equations for different configurations (e.g., different geometrical overlap configuration between the primary inductor and secondary inductor(s)). Once the mutual inductance is calculated, the effective primary inductance can be estimated by $L_{EffectivePrimary} = L_{Primary} - M$. When multiple secondary inductors are coupled to ground (i.e., when multiple switches closed), the net effective primary inductance is calculated using $L_{EffectivePrimaryNet} = L_{Primary} - M_{Net}$, where $M_{Net}$ can be evaluated using the combined (geometry dependent) contribution of the ground nets with the secondary inductor coils.

Figure 5:
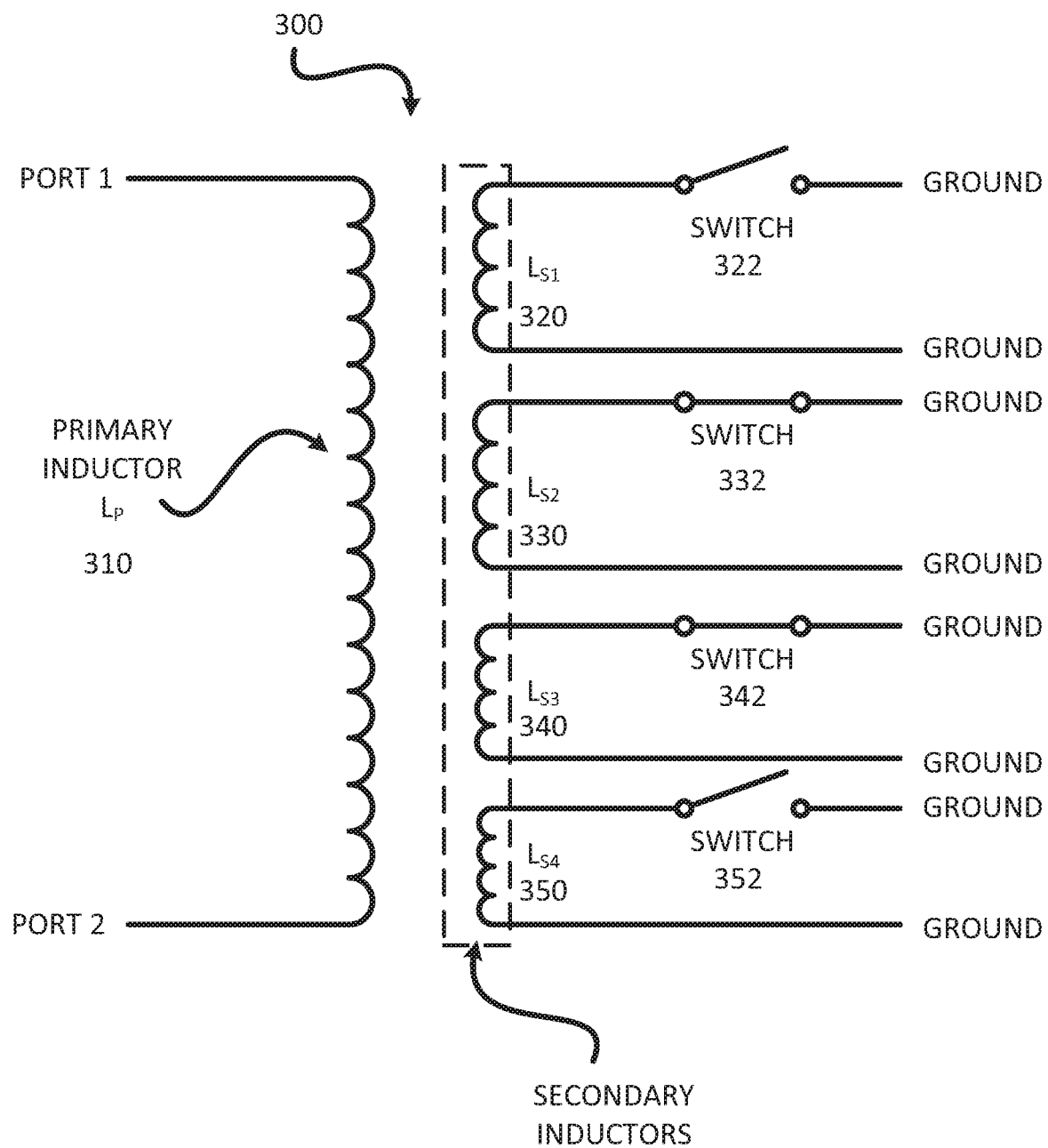
FIG. 5 illustrates a circuit diagram of a real time configurable inductor with some of the switches open.

FIG. 5 illustrates the circuit diagram 300 with a different configuration. FIG. 5 is similar to FIG. 3, except that two of the switches are closed. As shown in FIG. 5, the second switch 332 and the third switch are closed, which means that a current or a signal may passes through the second secondary inductor 330 and the third secondary inductor 340. The first switch 322 and the fourth switch 352 remain open.

FIGS. 3-5 illustrate three different examples of how the primary inductor 210 may have different effective inductances based on how the switches are opened and closed. Different implementations may use different configurations of switches and/or secondary inductors.

Exemplary Integrated Device Package Comprising a Real Time Tunable Inductor

Figure 6:
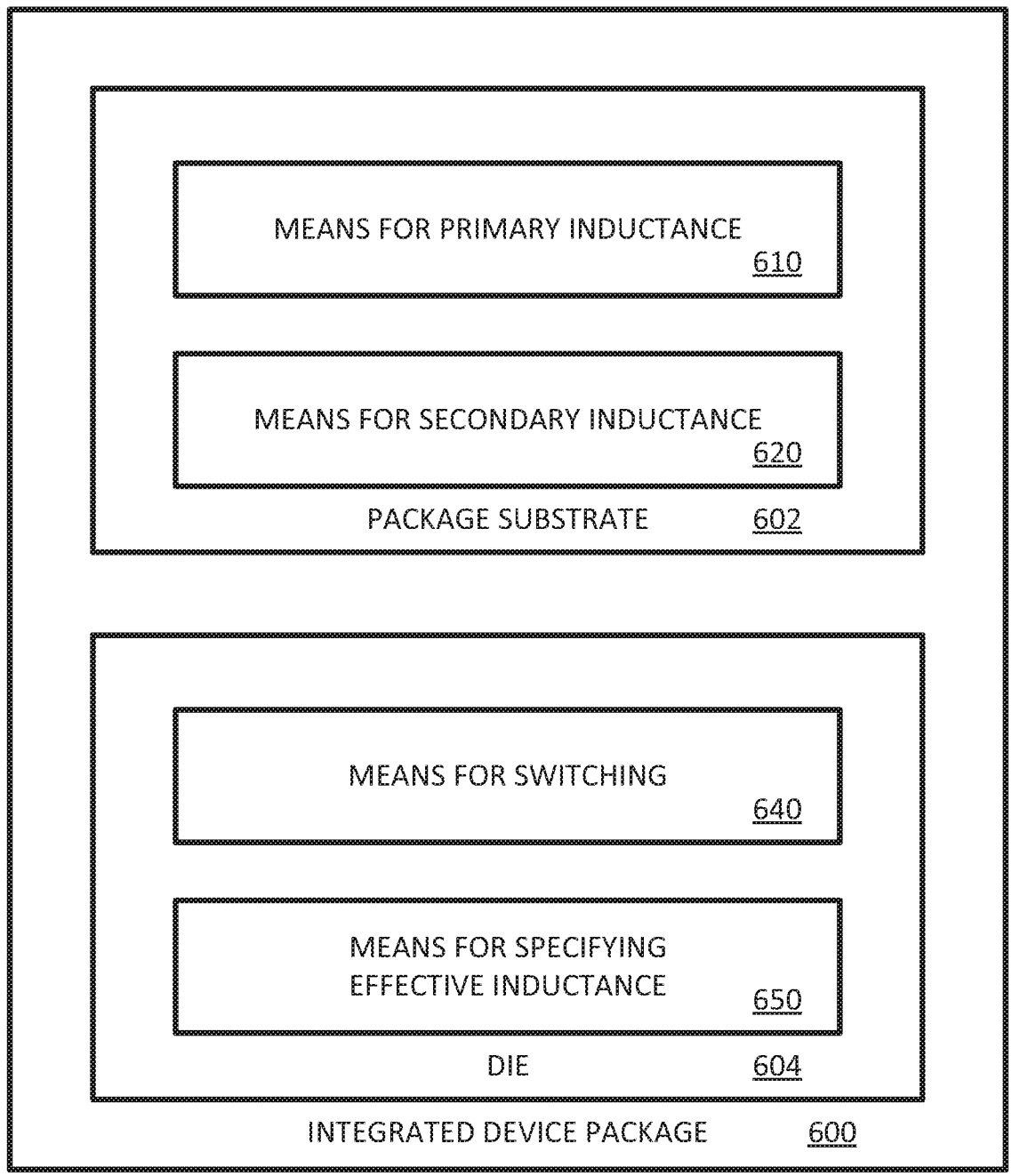
FIG. 6 illustrates various means implemented in a package substrate and a die to form a real time tunable inductor.

FIG. 6 illustrates a conceptual illustration of an integrated device package 600 that includes a real time tunable inductor. The integrated device package 600 includes a package substrate 602 and a die 604. The package substrate 602 includes a means for primary inductance 610 and a means for secondary inductance 620. The die 604 includes a means for switching 640 and a means for specifying effective inductance 650. In some implementations, a real time tunable inductor is a means for real time tunable inductance that includes the means for primary inductance 610, the means for secondary inductance 620, the means for switching 640 and the means for specifying effective inductance 650.

The means for primary inductance 610 may include the primary inductor 210. The means for secondary inductance 620 may include the first secondary inductor 220, the second secondary inductor 230, the third secondary inductor 240, and the fourth secondary inductor 250.

The means for switching 640 may include the first switch 222, the second switch 232, the third switch 242, and the fourth switch 252. The means for switching 640 is coupled to the means for secondary inductance 620. The means for switching 640 and the means for secondary inductance 620 may be configured to be coupled to a ground net. As mentioned above, a ground net includes a plurality of interconnects (e.g., means for interconnects in a die, means for interconnects in a package substrate) that are configured to provide an electrical path for a reference ground signal.

The means for specifying effective inductance 650 may include circuits that are configured to control the means for switching 640. The means for specifying effective inductance 650 is coupled to the means for secondary inductance 620.

Exemplary Method for Real Time Tuning of an Inductor

Figure 7:
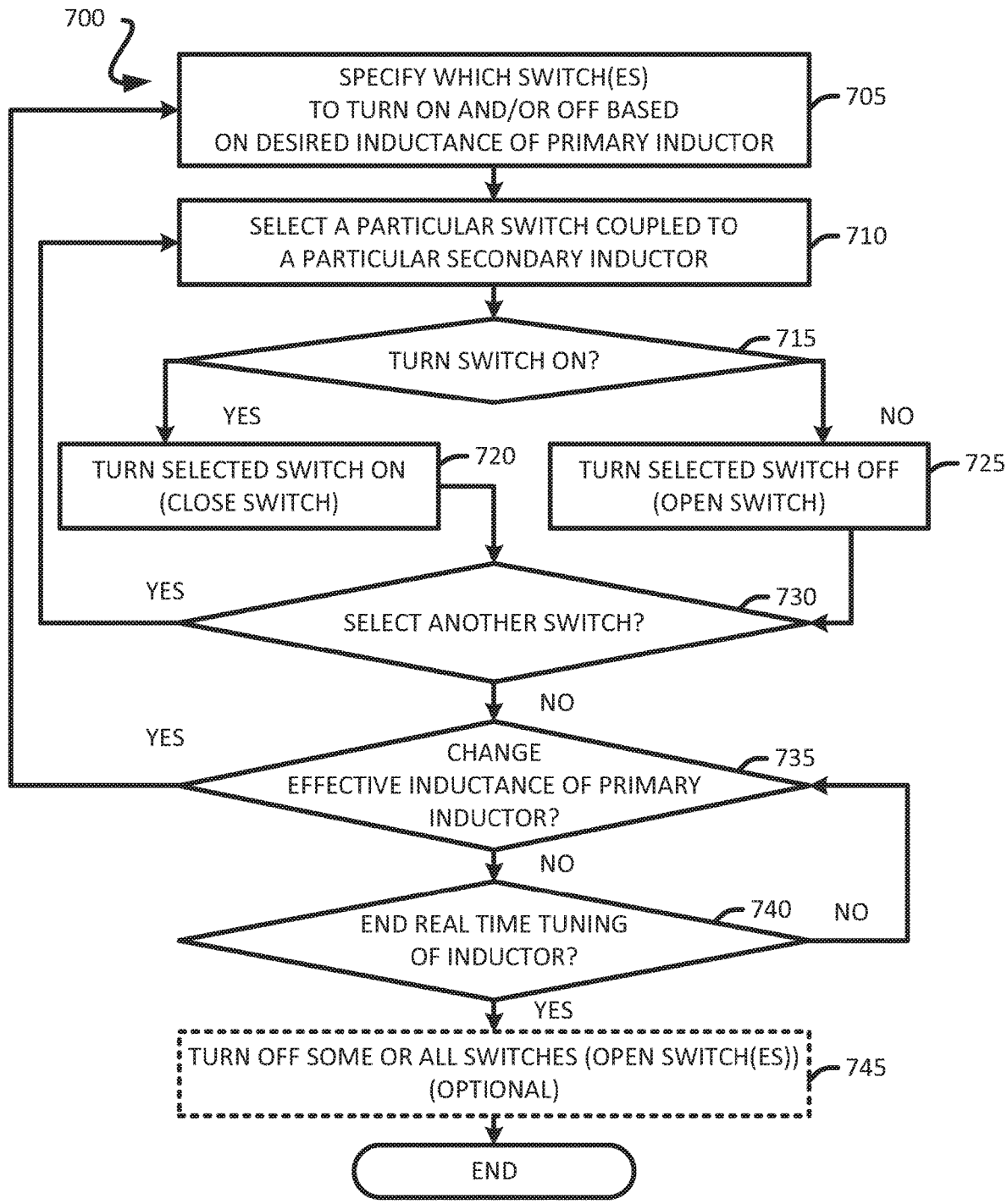
FIG. 7 illustrates a flow diagram of an exemplary method for providing real time tuning of inductor implemented in a package substrate.

FIG. 7 illustrates an exemplary method 700 for real time tuning of an inductor. In some implementations, the tuning of the inductor is performed while a die and/or an integrated device package is operational. In some implementations, the method 700 may be performed by an integrated device package (e.g., integrated device package 801) that includes a primary inductor (e.g., means for primary inductance), at least secondary inductor (e.g., means for secondary inductance), and at least one switch (e.g., means for switching). In some implementations, the method 700 is performed when a signal is transmitted through a primary inductor implemented in a package substrate.

The method specifies (at 705) which switch(es) (e.g., switch from a plurality of switches) to turn on and/or off based on a desired inductance of the primary inductor (e.g., primary inductor 210). Each particular switch (e.g., first switch 222) is coupled to a particular secondary inductor (e.g., first secondary inductor 220). It is noted that prior to specifying which switch to turn on or off, the switches may be on (e.g., closed switch) or off (e.g., open switch). That is, all the switches may be on, all the switches may be off, or some switches may be on while some switches may be off.

The method selects (at 710) a particular switch coupled to particular a secondary inductor (e.g., switch from a plurality of switches).

The method determines (at 715) whether to turn the selected switch on. If so, the method turns the selected switch on (at 720). In some implementations, turning the selected switch on (at 720) includes closing the switch, which allows a current or a signal to pass through the secondary inductor that is coupled to the selected switch. In some implementations, the current or signal is a reference ground signal.

When the method determines (at 715) not to turn the selected switch on, the method proceeds to turn the selected switch off (at 725). In some implementations, turning the selected switch off (at 725) include opening the switch, which does not allow a current or a signal to pass through the secondary inductor that is coupled to the selected switch.

The method determines (at 730) whether to select another switch. If so, the method proceeds to select (at 710) another switch coupled to another secondary inductor. In some implementations, the method may iteratively select and turn on and off several switches, while a die and/or an integrated device package is operational.

When the method determines (at 730) not to select another, the method determines (at 735) whether to change the effective inductance of the primary inductor. If so, the method proceeds back 705 to specify which switches to turn on and off based on a desired effective inductance for the primary inductor.

When the method determines (at 735) not to change the effective inductance of the primary inductor, the method then determines (at 740) whether to end the real time tuning of the primary inductor. If not, the method proceeds back to 735.

When the method determines (at 740) to end the real time tuning of the primary inductor, the method may optionally turn off (at 745) some or all switches (e.g., open all the switches), and the method 700 of tuning the inductor may end. In some implementations, the switches are left as is (i.e., the switches are not changed). In some implementations, the switches may be reset.

Having described the various components of a real time tunable inductor and how a real time tunable inductor may be tuned and/or configured, various integrated device packages that include a real time tunable inductor will now be described below.

Exemplary Integrated Device Packages Comprising a Real Time Tunable Inductor

Figure 8:
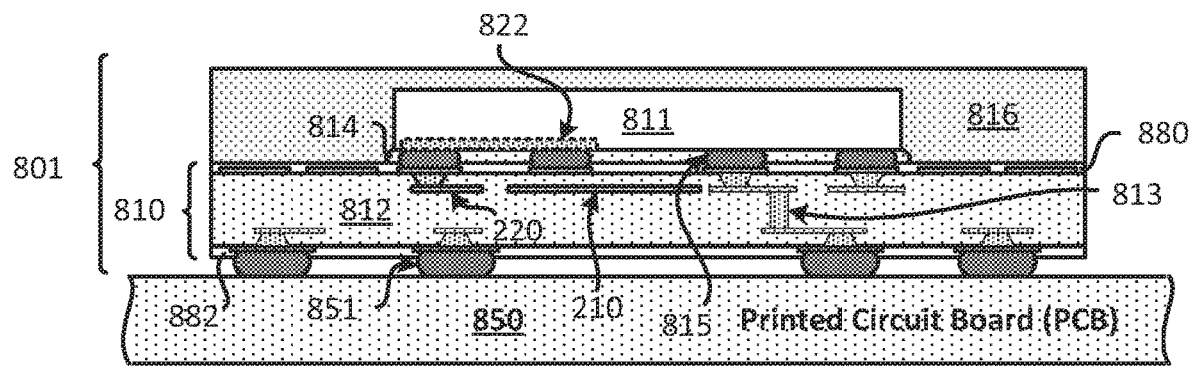
FIG. 8 illustrates a profile view of an integrated device package that includes a real time tunable inductor implemented in a package substrate.

FIG. 8 illustrates an integrated device package 801 that includes a real time tunable inductor. The integrated device package 801 includes a package substrate 810 and a die 811. The integrated device package 801 is coupled to a printed circuit board (PCB) 850 through a plurality of solder balls 851.

As shown in FIG. 8, the integrated device package 801 includes the package substrate 810, the die 811, an underfill 814, a plurality of solder balls 815, and an encapsulation layer 816.

The package substrate 810 includes at least one dielectric layer 812. The at least one dielectric layer 812 may include a core layer and/or a prepeg layer. The package substrate 810 includes the primary inductor 210 and at least one secondary inductor (e.g., first secondary inductor 220). The primary inductor 210 (e.g., means for primary inductance) and the at least one secondary inductor (e.g., means for secondary inductance) may be substantially co-planar with each other in the package substrate 810 (e.g., on same metal layer of the package substrate 810). The primary inductor 210 may be defined by interconnects (e.g., traces, pads, vias) in the package substrate 810, as described in FIG. 2 above. Similarly, the first secondary inductor 220 may be defined by interconnects (e.g., traces, pads, vias) in the package substrate 810, as described in FIG. 2 above.

The package substrate 810 also include a plurality of interconnects 813. Some interconnects from the plurality of interconnects 813 may be configured as a ground net. That is, some interconnects from the plurality of interconnects may be configured to provide an electrical path for a reference ground signal. One or more of the secondary inductors (e.g., first secondary inductor 220) is coupled to one or more interconnects (from the plurality of interconnects 813) configured as a ground net.

The package substrate 810 may also include a first solder resist layer 880 and a second solder resist layer 882. The first solder resist layer 880 is formed on a first surface of the package substrate 810, and the second solder resist layer 882 is formed on a second surface of the package substrate 810.

The die 811 is coupled to the package substrate 810 through the plurality of solder balls 815. The die 811 includes at least one switch 822 (e.g., means for switch). The at least one switch 822 may include transistors. The at least one switch 822 may include the first switch 222, the second switch 232, the third switch 242, and the fourth switch 252, as described in FIG. 2. The die 811 may also include a circuit for controlling the switch 822.

The die 811 is configured to be electrically coupled to the primary inductor 210 and the at least one secondary inductor (e.g., first secondary inductor 220) of the package substrate 810. The at least one switch 822 is coupled to the at least one secondary inductor (e.g., first secondary inductor 220) of the package substrate 810. In some implementations, the at least one switch 822 is configured to be electrically coupled to the ground net.

The encapsulation layer 816 is coupled to the package substrate 810 and the die 811. The encapsulation layer 816 at least partially encapsulates the die 811.

In some implementations, the primary inductor 210, the first secondary inductor 220, and the switch 822 may define a tunable inductor implemented in the integrated device package 801.

Figure 9:
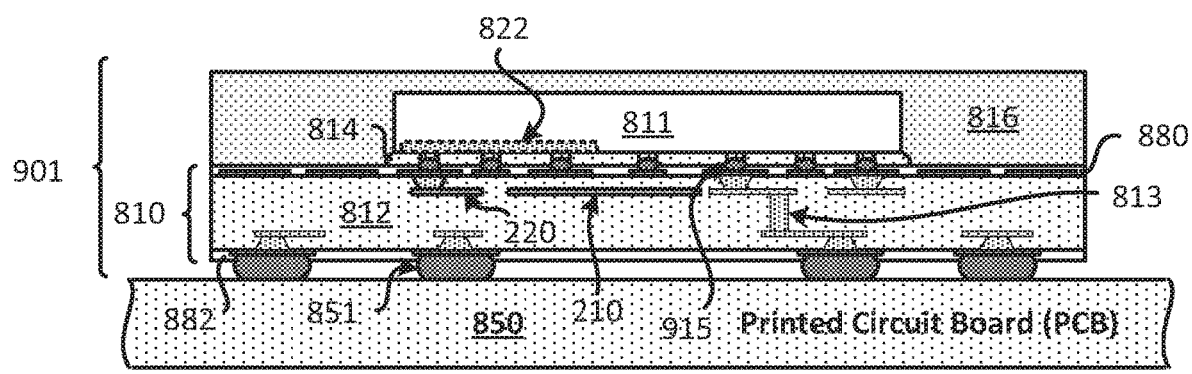
FIG. 9 illustrates a profile view of an integrated device package that includes a real time tunable inductor implemented in a package substrate.

FIG. 9 illustrates another integrated device package 901 that includes a real time tunable inductor. The integrated device package 901 of FIG. 9 is similar to the integrated device package 801 of FIG. 8, except that the die 811 is coupled to the package substrate 810 differently.

As shown in FIG. 9, the integrated device package 901 includes the package substrate 810, the die 811, the underfill 814, a plurality of interconnects 915, and the encapsulation layer 816. FIG. 9 illustrates that the die 811 is coupled to the package substrate 810 through the plurality of interconnects 915.

The plurality of interconnects 915 includes a plurality of pillars (e.g., copper pillars) and a plurality of solder interconnects (e.g., solder balls). In some implementations, the plurality of interconnects 915 have higher aspect ratio (e.g., height to width ratio) than the plurality of solder balls 815. In some implementations, plurality of interconnects 915 includes a smaller pitch and spacing between interconnects, than the pitch and/or spacing of solder balls from the plurality of solder balls 815, thus providing a higher density connection between the die 811 and the package substrate 810.

Figure 10A:
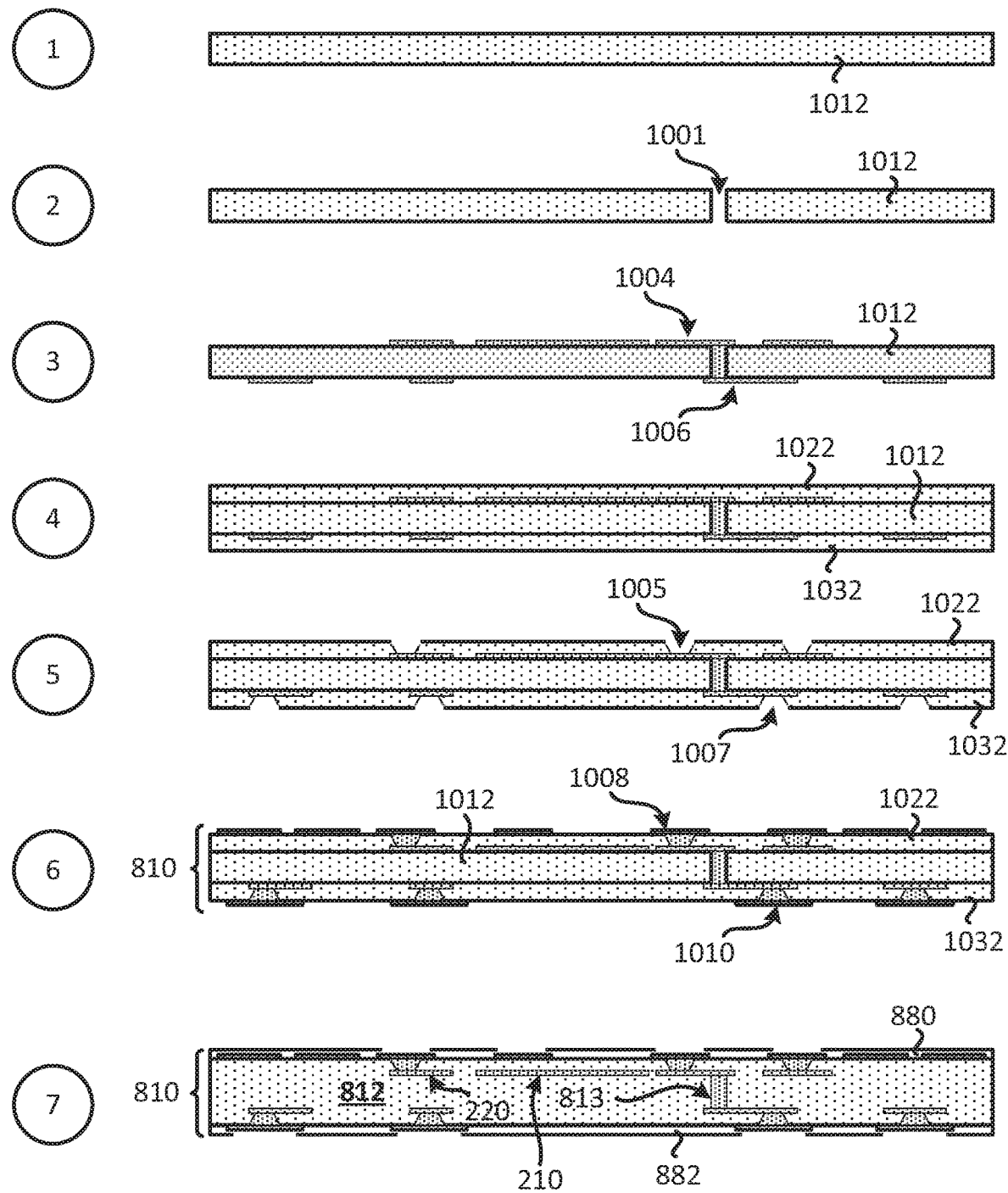
FIG. 10 (which includes FIGS. 10A-10B) illustrates a flow diagram of an exemplary method for fabricating an integrated device package that includes a real time tunable inductor implemented in a package substrate.
Figure 10B:
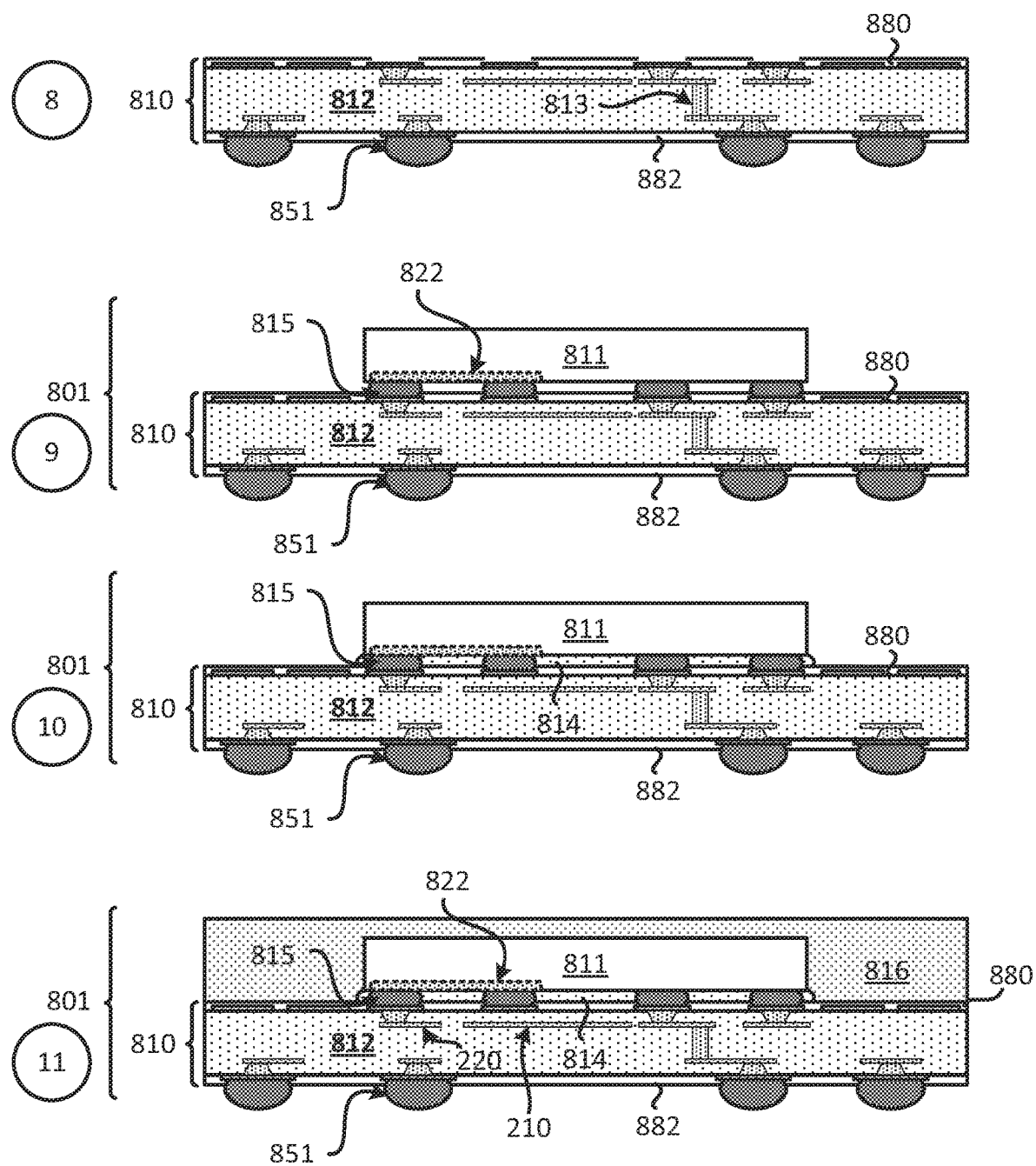

Exemplary Sequence for Fabricating an Integrated Device Packages Comprising a Real Time Tunable Inductor In some implementations, providing/fabricating an integrated device package that includes a real time tunable inductor includes several processes. FIG. 10 (which includes FIGS. 10A-10B) illustrates an exemplary sequence for providing/fabricating an integrated device package that includes a real time tunable inductor. In some implementations, the sequence of FIGS. 10A-21B may be used to fabricate the integrated device package that includes a real time tunable inductor package of FIGS. 8 and 9 and/or other integrated device packages described in the present disclosure. FIGS. 10A-10B will be described in the context of providing/fabricating the integrated device package of FIG. 8. In particular, FIGS. 10A-10B will be described in the context of fabricating the integrated device package 801 of FIG. 8.

It should be noted that the sequence of FIGS. 10A-10B may combine one or more stages in order to simplify and/or clarify the sequence for providing a package. In some implementations, the order of the processes may be changed or modified.

Stage 1, as shown in FIG. 10A, illustrates a first dielectric layer 1012 provided. The first dielectric layer 1012 may be a core layer. The first dielectric layer 1012 may be formed or provided by a supplier.

Stage 2 illustrates at least one cavity 1001 formed in the first dielectric layer 1012. Different implementations may form the cavity 1001 in the first dielectric layer 1012 differently. A laser process and/or a photo-lithography process may be used to form the cavity 1001.

Stage 3 illustrates a first metal layer 1004 and a second metal layer 1006 formed on and/or in the first dielectric layer 1012. The first metal layer 1004 and the second metal layer 1006 may represent the plurality of interconnects 813, as described above in at least FIG. 8.

Stage 4 illustrates a second dielectric layer 1022 and a third dielectric layer 1032 formed on the first dielectric layer 1012.

Stage 5 illustrates at least one cavity 1005 formed in the second dielectric layer 1022, and at least one cavity 1007 formed in the third dielectric layer 1032. Different implementations may form the cavity 1005 in the second dielectric layer 1022 and the cavity 1007 in the third dielectric layer 1032 differently. A laser process and/or a photo-lithography process may be used to form the cavity 1005 and/or the cavity 1007.

Stage 6 illustrates a third metal layer 1008 formed on and/or in the second dielectric layer 1022, a fourth metal layer 1010 formed on and/or in the third dielectric layer 1032. The third metal layer 1008 and the fourth metal layer 1010 may represent the plurality of interconnects 813, as described above in at least FIG. 8. Stage 6 may represent a package substrate (e.g., package substrate 810) that includes at least one dielectric layer and a plurality of interconnects.

Stage 7 illustrates a first solder resist layer 880 formed over the dielectric layer 812, and a second solder resist layer 882 formed over the dielectric layer 812. The dielectric layer 812 may collectively represent the first dielectric layer 1012, the second dielectric layer 1022, and the third dielectric layer 1032. Stage 7 may represent a package substrate (e.g., package substrate 810) that includes the dielectric layer 812, the plurality of interconnects 813, the first solder resist layer 880, and the second solder resist layer 882. Some interconnects from the plurality of interconnects 813 may be configured to be electrically coupled to a ground net. Stage 7 also illustrates that the package substrate 810 includes the primary inductor 210 and the first secondary inductor 220 that is formed in the dielectric layer 812. The primary inductor 210 is co-planar with the first secondary inductor 220. The primary inductor 210 and the first secondary inductor 220 may be formed by interconnects in the package substrate 810.

Stage 8, as shown in FIG. 10B, illustrates the plurality of solder balls 851 coupled to the package substrate 810. In particular, the plurality of solder balls 852 is coupled to the plurality of interconnects 813.

Stage 9 illustrates the die 811 coupled to the package substrate 810, through the plurality of solder balls 815. Different implementations may couple the die 811 to the package substrate 810 differently (e.g., by using interconnect pillars). In some implementations, a reflow process (e.g., chip attach reflow process) may be used to couple the die 811 to the package substrate 810. In some implementations, a reflux process may be used after the reflow process. The die 811 may include at least one switch 822.

Stage 10 illustrates an underfill 814 provided between the die 811 and the package substrate 810. The underfill 814 may at least partially surround the plurality of solder balls 815. In some implementations, providing the underfill 814 includes an underfill dispense process.

Stage 11 illustrates an encapsulation layer 816 that is formed over the package substrate 810 and the die 811. The encapsulation layer 816 at least partially encapsulates the die 811. Stage 11 may illustrates an integrated device package 801 that includes the package substrate 810, the die 811, the primary inductor 210, the first secondary inductor 220, and the switch 822.

In some implementations, several packages (e.g., integrated device packages) are concurrently fabricated on wafer, and a singulation process is performed to cut a wafer into individual packages.

Figure 11:
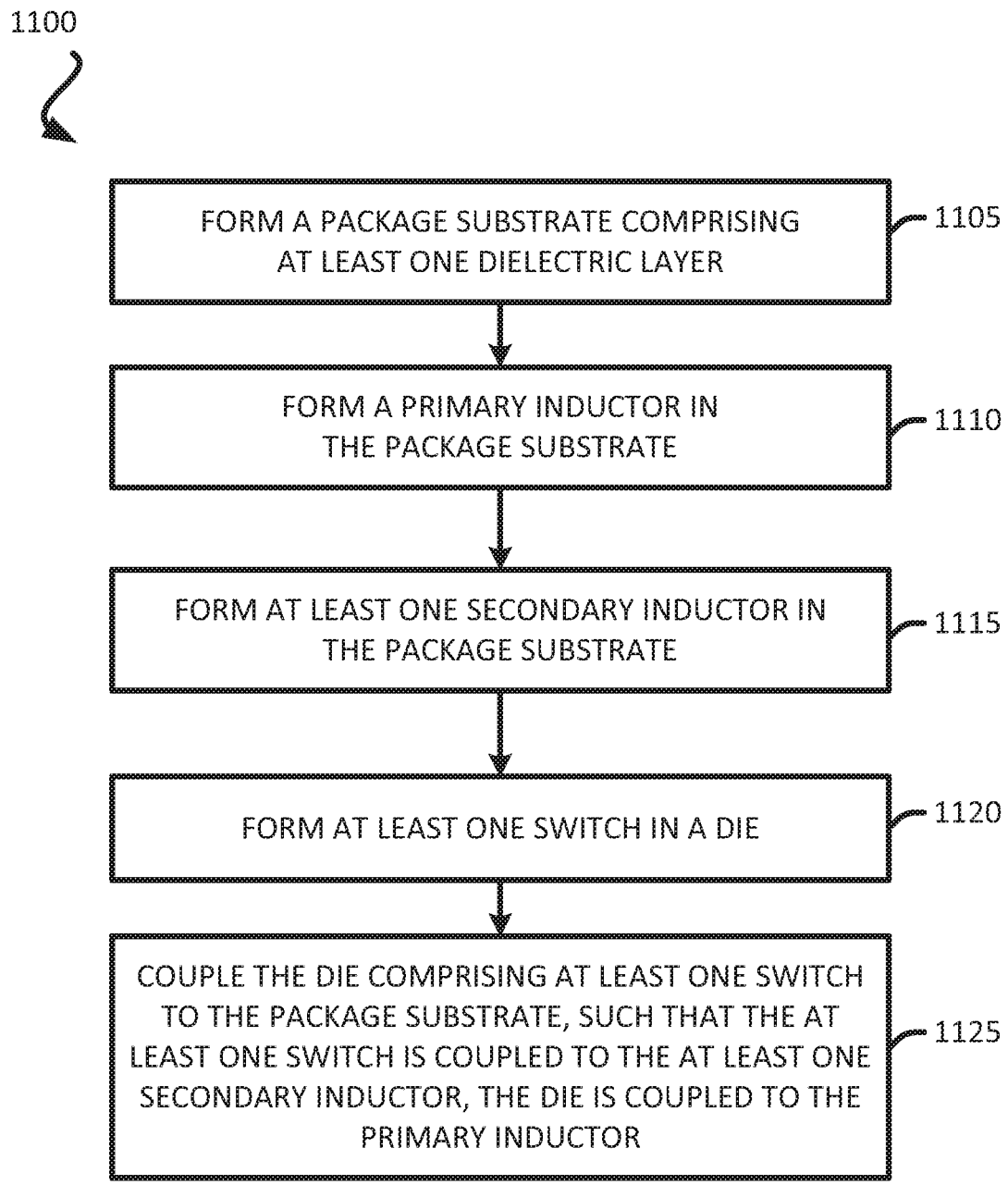
FIG. 11 illustrates an example of a sequence for fabricating an integrated device package that includes a real time tunable inductor implemented in a package substrate.

Exemplary Method for Fabricating an Integrated Device Packages Comprising a Real Time Tunable Inductor In some implementations, providing/fabricating an integrated device package that includes a real time tunable inductor includes several processes. FIG. 11 illustrates an exemplary flow diagram of a method for providing/fabricating an integrated device package that includes a real time tunable inductor. In some implementations, the method of FIG. 11 may be used to provide/fabricate the integrated device package that includes a real time tunable inductor of FIGS. 8-9 and/or other integrated device packages described in the present disclosure. FIG. 11 will be described in the context of providing/fabricating the integrated device package 801 of FIG. 8.

It should be noted that the flow diagram of FIG. 11 may combine one or more processes in order to simplify and/or clarify the method for providing an integrated device package that includes a real time tunable inductor. In some implementations, the order of the processes may be changed or modified.

The method forms (at stage 1105) a package substrate (e.g., package substrate 810) that includes at least one dielectric layer (e.g., dielectric layer 812). In some implementations, forming the package substrate includes forming at least one metal layer and at least one solder resist layer. In some implementations, forming the package substrate includes forming at least one interconnect that is configured to be a ground net.

The method forms (at 1110) a primary inductor (e.g., primary inductor 210) in the package substrate. In some implementations, forming the primary inductor may include forming interconnects (e.g., traces, pads, vias) in the package substrate.

The method forms (at 1115) at least one secondary inductor (e.g., first secondary inductor 220) in the package substrate. In some implementations, forming the secondary inductor may include forming interconnects (e.g., traces, pads, vias) in the package substrate. In some implementations, forming the secondary inductor including forming the secondary inductor such that the secondary inductor is at least substantially co-planar with the primary inductor in the package substrate. In some implementations, the secondary inductor is configured to be coupled to a ground net.

The method forms (at 1120) at least one switch (e.g., switch 822) in a die (e.g., die 811). In some implementations, forming the at least one switch includes forming a transistor in the die.

The method couples (at 1125) the die comprising the at least switch to the package substrate, such that the at least one switch is coupled to the at least one secondary inductor. In some implementations, the die is coupled to the package substrate such that the die is coupled to the primary inductor.

Exemplary Electronic Devices

Figure 12:
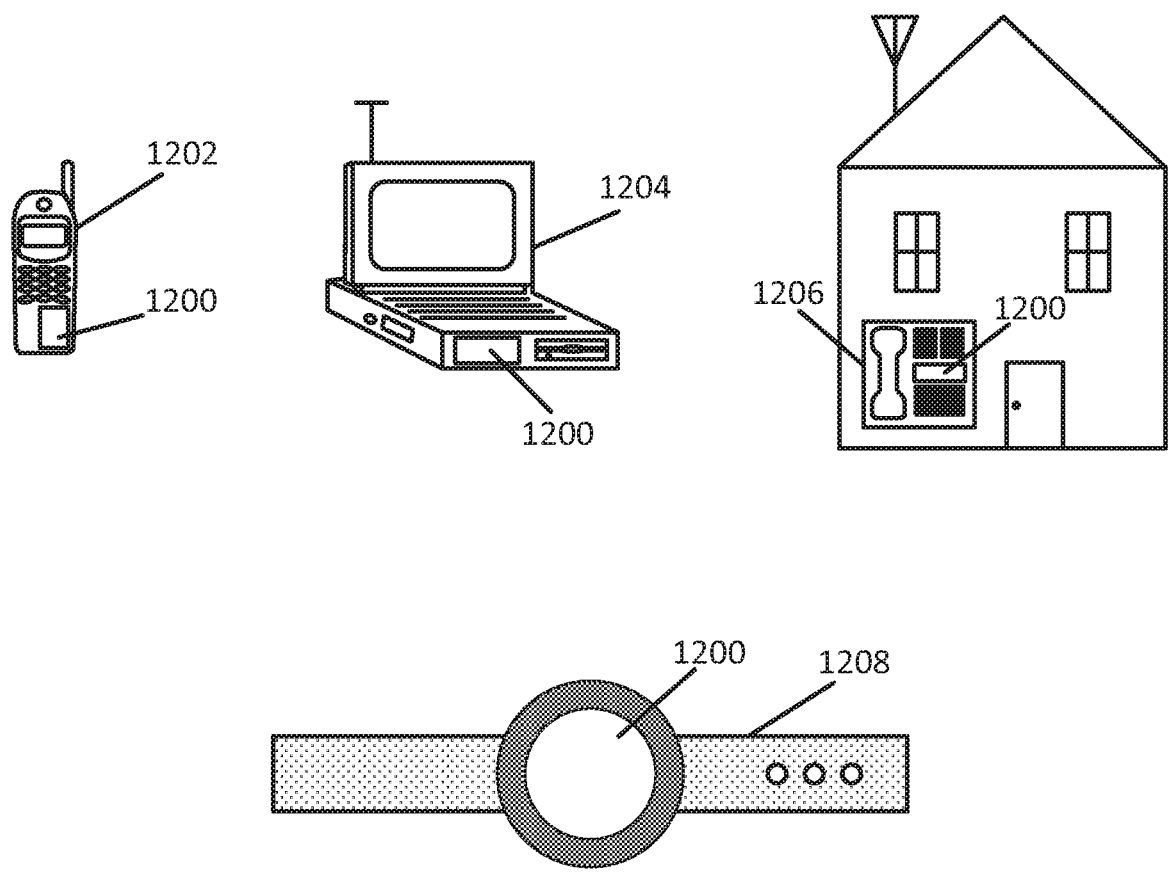
FIG. 12 illustrates various electronic devices that may include the various integrated devices, integrated device packages, semiconductor devices, dies, integrated circuits, and/or packages described herein.

FIG. 12 illustrates various electronic devices that may be integrated with any of the aforementioned integrated device, semiconductor device, integrated circuit, die, interposer, package or package-on-package (PoP). For example, a mobile phone device 1202, a laptop computer device 1204, a fixed location terminal device 1206, a wearable device 1208 may include an integrated device 1200 as described herein. The integrated device 1200 may be, for example, any of the integrated circuits, dies, integrated devices, integrated device packages, integrated circuit devices, device packages, integrated circuit (IC) packages, package-on-package devices described herein. The devices 1202, 1204, 1206, 1208 illustrated in FIG. 12 are merely exemplary. Other electronic devices may also feature the integrated device 1200 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watch, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2, 3, 4, 5, 6, 7, 8, 9, 10A-10B, 11, and/or 12 may be rearranged and/or combined into a single component, process, feature or function or embodied in several components, processes, or functions. Additional elements, components, processes, and/or functions may also be added without departing from the disclosure. It should also be noted that FIGS. 2, 3, 4, 5, 6, 7, 8, 9, 10A-10B, 11, and/or 12 and its corresponding description in the present disclosure is not limited to dies and/or ICs. In some implementations, FIGS. 2, 3, 4, 5, 6, 7, 8, 9, 10A-10B, 11, and/or 12 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

One or more devices (e.g., die) in an integrated device package may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium and/or a processor-readable medium. The computer-readable medium and/or a processor-readable medium may be a non-transitory computer-readable medium and/or a non-transitory processor-readable medium. A non-transitory computer-readable medium and/or a non-transitory processor-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may reside in a memory of an integrated device package, external to the integrated device package, or distributed across multiple entities including the integrated device package. The computer-readable medium and/or the processor-readable medium may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

The algorithms described herein may also be efficiently implemented in software and/or embedded in hardware. It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein. Additional elements, components, steps, and/or functions may also be added or not utilized without departing from the disclosure.

Also, it is noted that at least some implementations have been described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. In some aspects, a process may correspond to a method, a function, a procedure, a subroutine, a subprogram, etc. When a process corresponds to a function, its termination corresponds to a return of the function to the calling function or the main function. One or more of the various methods described herein may be partially or fully implemented by programming (e.g., instructions and/or data) that may be stored in a machine-readable, computer-readable, and/or processor-readable storage medium, and executed by one or more processors, machines and/or devices. A processor may include one or more processors. A processor may include one or more processor core.

Those of skill in the art would further appreciate that the various illustrative logical blocks, modules, circuits, and algorithm steps described in connection with the implementations disclosed herein may be implemented as hardware, software, firmware, middleware, microcode, or any combination thereof. To clearly illustrate this interchangeability, various illustrative components, blocks, modules, circuits, and steps have been described above generally in terms of their functionality. Whether such functionality is implemented as hardware or software depends upon the particular application and design constraints imposed on the overall system.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A device comprising:
   a die comprising a first switch; and
   a package substrate coupled to the die, the package substrate comprising:
      at least one dielectric layer;
      a first interconnect configured to operate as a primary inductor,
         wherein the primary inductor includes more than one turn,
         wherein the first interconnect includes a first portion and a second portion,
         wherein the first portion is part of a first turn of the primary inductor, and
         wherein the second portion is part of another turn of the primary inductor,
      a second interconnect configured to operate as a first secondary inductor coupled to the first switch of the die,
         wherein the second interconnect is located between the first portion and the second portion of the first interconnect,
         wherein the second interconnect is adjacent to the first portion and the second portion of the first interconnect,
         wherein the second interconnect is configured to provide a path for ground,
         wherein the second interconnect is on a same metal layer of the package substrate as the first interconnect,
      a via coupled to the second interconnect; and
      another interconnect coupled to the second interconnect through the via,
         wherein the another interconnect is located on a different metal layer of the package substrate than the first interconnect and the second interconnect,
         wherein the another interconnect vertically travels above or below the first interconnect,
      wherein the first switch of the die is configured to be coupled to the second interconnect through the another interconnect and the via, and
      wherein the primary inductor is configurable to have different inductances by opening and closing the first switch coupled to the first secondary inductor.

2. The device of claim 1, wherein the package substrate comprises a plurality of interconnects configured to provide an electrical path for ground, and wherein the first secondary inductor and the first switch are coupled to the plurality of interconnects.

3. The device of claim 2, wherein the first secondary inductor includes a first terminal and a second terminal, wherein the first terminal and the second terminal of the first secondary inductor are coupled to the plurality of interconnects configured to provide an electrical path for ground.

4. The device of claim 1, wherein the primary inductor is configurable in real time while the die is operational.

5. The device of claim 1, wherein the die further comprises a second switch, and the package substrate further comprises a second secondary inductor coupled to the second switch of the die, wherein the second secondary inductor and the second switch are coupled to a plurality of interconnects configured to provide an electrical path for ground.

6. The device of claim 1, wherein the package substrate further includes:
   a third interconnect configured to operate as a second secondary inductor coupled to a second switch of the die, wherein the third interconnect is located between a third portion and a fourth portion of the first interconnect; and
   a fourth interconnect configured to operate as a third secondary inductor coupled to a third switch of the die, wherein the fourth interconnect is located between a fifth portion and a sixth portion of the first interconnect;
   wherein the second interconnect, the third interconnect and the fourth interconnect are configured to provide a path for ground,
   wherein the second interconnect, the third interconnect and the fourth interconnect are located on the same metal layer of the package substrate as the first interconnect, and
   wherein the primary inductor is a spiral inductor that includes more than one turn.

7. The device of claim 6, wherein the primary inductor is configurable to have different inductances (i) by opening or closing the first switch, (ii) by opening or closing the second switch, and/or (iii) by opening or closing the third switch.

8. The device of claim 1, wherein the package substrate further includes:
   a third interconnect configured to operate as a second secondary inductor coupled to a second switch of the die, wherein the third interconnect is located between a third portion and a fourth portion of the first interconnect, the third portion and the fourth portion are parallel to one another;
   a fourth interconnect configured to operate as a third secondary inductor coupled to a third switch of the die, wherein the fourth interconnect is located between a fifth portion and a sixth portion of the first interconnect, the fifth portion and the sixth portion are parallel to one another; and
   a fifth interconnect configured to operate as a fourth secondary inductor coupled to a fourth switch of the die, wherein the fifth interconnect is located between a seventh portion and an eighth portion of the first interconnect, the seventh portion and the eighth portion are parallel to one another,
   wherein the second interconnect, the third interconnect, the fourth interconnect and the fifth interconnect are configured to provide a path for ground, and
   wherein the second interconnect, the third interconnect, the fourth interconnect and the fifth interconnect are located on the same metal layer of the package substrate as the first interconnect.

9. The device of claim 1, wherein the device is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

10. An apparatus comprising:
   a die comprising a means for switching; and
   a package substrate coupled to the die, the package substrate comprising:
      at least one dielectric layer;
      means for primary inductance that includes a first interconnect having a first portion and a second portion,
         wherein the means for primary inductance includes more than one turn,
         wherein the first portion is part of a first turn of the means for primary inductance, and
         wherein the second portion is part of another turn of the means for primary inductance; and
      means for secondary inductance coupled to the means for switching of the die,
         wherein the means for secondary inductance includes a second interconnect that is located between the first portion and the second portion of the first interconnect,
         wherein the second interconnect is adjacent to the first portion and the second portion of the first interconnect,
         wherein the second interconnect is configured to provide a path for ground,
         wherein the second interconnect is on a same metal layer of the package substrate as the first interconnect,
      a via coupled to the second interconnect; and
      another interconnect coupled to the second interconnect through the via,
         wherein the another interconnect is located on a different metal layer of the package substrate than the first interconnect and the second interconnect,
         wherein the another interconnect vertically travels above or below the first interconnect,
         wherein the means for switching of the die is configured to be coupled to the second interconnect through the another interconnect and the via, and
         wherein the means for primary inductance is configurable to have different inductances by opening and closing the means for switching coupled to the means for secondary inductance.

11. The apparatus of claim 10, wherein the package substrate includes a plurality of interconnects configured to provide an electrical path for ground, and wherein the means for secondary inductance and the means for switching are coupled to the plurality of interconnects.

12. The apparatus of claim 11, wherein the means for secondary inductance include a first terminal and a second terminal, wherein the first terminal and the second terminal of the means for secondary inductance are coupled to the plurality of interconnects configured to provide an electrical path for ground.

13. The apparatus of claim 10, wherein the means for primary inductance is configurable in real time while the die is operational, wherein the first portion and the second portion of the first interconnect has a first combined length that is greater than a second length of the second interconnect.

14. The apparatus of claim 10, wherein the means for secondary inductance includes:
   a third interconnect located between a third portion and a fourth portion of the first interconnect, the third interconnect is parallel to the third portion and the fourth portion of the first interconnect,
   wherein the second interconnect and the third interconnect are configured to provide a path for ground,
   wherein the second interconnect and the third interconnect are located on the same metal layer of the package substrate as the first interconnect, and
   wherein the means for primary inductance is a spiral inductor that includes more than one turn.

15. The apparatus of claim 10, wherein the means for secondary inductance includes:
   a third interconnect located between a third portion and a fourth portion of the first interconnect;
   a fourth interconnect located between a fifth portion and a sixth portion of the first interconnect; and
   a fifth interconnect located between a seventh portion and an eighth portion of the first interconnect,
   wherein the second interconnect, the third interconnect, the fourth interconnect and the fifth interconnect are configured to provide a path for ground, and
   wherein the second interconnect, the third interconnect, the fourth interconnect and the fifth interconnect are located on the same metal layer of the package substrate as the first interconnect.

16. The apparatus of claim 10, wherein the means for secondary inductance includes a plurality of secondary inductors.

17. The apparatus of claim 10, wherein the apparatus is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

18. A method for tuning an inductor, comprising:
   transmitting a signal through a primary inductor comprising a first inductance,
      wherein the primary inductor is implemented in a package substrate,
      wherein the primary inductor includes more than one turn,
      wherein the primary inductor includes a first interconnect having a first portion and a second portion,
      wherein the first portion is part of a first turn of the primary inductor, and
      wherein the second portion is part of another turn of the primary inductor;
   determining to change the first inductance of the primary inductor; and
   closing a first switch coupled to a first secondary inductor to change the first inductance of the primary inductor to a second inductance,
      wherein the first switch is implemented in a die,
      wherein the first secondary inductor is implemented in the package substrate,
      wherein the first secondary inductor includes a second interconnect located between the first portion and the second portion of the first interconnect,
      wherein the second interconnect is adjacent to the first portion and the second portion of the first interconnect,
      wherein the second interconnect is configured to provide a path for ground, wherein the second interconnect is on a same metal layer of the package substrate as the first interconnect, wherein the second interconnect is configured to be coupled to the first switch of the die through a via and another interconnect coupled to the via, wherein the another interconnect is located on a different metal layer of the package substrate than the first interconnect and the second interconnect, and wherein the another interconnect vertically travels above or below the first interconnect.

19. The method of claim 18, further comprising closing a second switch coupled to a second secondary inductor to change the first inductance of the primary inductor to a third inductance, wherein the second switch is implemented in the die, and wherein the second secondary inductor is implemented in the package substrate.

20. The method of claim 19, further comprising:
determining to further change the third inductance of the primary inductor; and
opening the first switch coupled to the first secondary inductor to change the third inductance of the primary inductor to a fourth inductance.

21. The method of claim 18, wherein transmitting the signal, determining to change the first inductance of the primary inductor, and closing the first switch coupled to the first secondary inductor, are performed while a device package comprising the die, is operational.

22. The method of claim 18, wherein the first secondary inductor and the first switch are coupled to a plurality of interconnects configured to provide an electrical path for ground.

23. A non-transitory processor-readable storage medium comprising code for:
transmitting a signal through a primary inductor comprising a first inductance,
wherein the primary inductor is implemented in a package substrate,
wherein the primary inductor includes more than one turn,
wherein the primary inductor includes a first interconnect having a first portion and a second portion,
wherein the first portion is part of a first turn of the primary inductor, and
wherein the second portion is part of another turn of the primary inductor;
determining to change the first inductance of the primary inductor; and
closing a first switch coupled to a first secondary inductor to change the first inductance of the primary inductor to a second inductance,
wherein the first switch is implemented in a die,
wherein the first secondary inductor is implemented in the package substrate, wherein the first secondary inductor includes a second interconnect located between the first portion and the second portion of the first interconnect, wherein the second interconnect is adjacent to the first portion and the second portion of the first interconnect, wherein the second interconnect is configured to provide a path for ground, wherein the second interconnect is on a same metal layer of the package substrate as the first interconnect, wherein the second interconnect is configured to be coupled to the first switch of the die through a via and another interconnect coupled to the via, wherein the another interconnect is located on a different metal layer of the package substrate than the first interconnect and the second interconnect, and wherein the another interconnect vertically travels above or below the first interconnect.

24. The non-transitory processor-readable storage medium of claim 23, further comprising code for closing a second switch coupled to a second secondary inductor to change the first inductance of the primary inductor to a third inductance, wherein the second switch is implemented in the die, and wherein the second secondary inductor is implemented in the package substrate.

25. The non-transitory processor-readable storage medium of claim 24, further comprising code for:
determining to further change the third inductance of the primary inductor; and
opening the first switch coupled to the first secondary inductor to change the third inductance of the primary inductor to a fourth inductance.

26. The non-transitory processor-readable storage medium of claim 23, wherein code for transmitting the signal, determining to change the first inductance of the primary inductor, and closing the first switch coupled to the first secondary inductor, are performed while a device package comprising the die, is operational.

27. The non-transitory processor-readable storage medium of claim 23, wherein the first secondary inductor and the first switch are coupled to a plurality of interconnects configured to provide an electrical path for ground.

28. The device of claim 1, wherein the secondary inductor is located laterally between the first turn of the primary inductor and the another turn of the primary inductor.

29. The device of claim 1, wherein the primary inductor is configured to be an inner most inductor such that within the same metal layer as the primary inductor, there is no secondary inductor located within an inner portion defined by a loop of the primary inductor.

* * * * *